US008653606B2

United States Patent
Shiraishi

(10) Patent No.: US 8,653,606 B2
(45) Date of Patent: Feb. 18, 2014

(54) SEMICONDUCTOR DEVICE AND POWER CONVERSION DEVICE USING SAME

(71) Applicant: Hitachi, Ltd., Tokyo (JP)

(72) Inventor: Masaki Shiraishi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/928,894

(22) Filed: Jun. 27, 2013

(65) Prior Publication Data
US 2014/0003109 A1 Jan. 2, 2014

(30) Foreign Application Priority Data
Jun. 28, 2012 (JP) ................... 2012-144893

(51) Int. Cl.
*H01L 29/66* (2006.01)
*H01L 29/739* (2006.01)
*H01L 29/96* (2006.01)

(52) U.S. Cl.
USPC ............ 257/378; 257/E29.028; 257/E29.066; 257/E29.197; 257/E29.201; 363/127

(58) Field of Classification Search
USPC ............... 257/288, 378, E29.28, E29.066, 257/E29.197, E29.201; 363/127
See application file for complete search history.

(56) References Cited

U.S. PATENT DOCUMENTS

| 5,828,100 | A | * | 10/1998 | Tamba et al. | ............... | 257/328 |
| 6,448,587 | B1 | * | 9/2002 | Kohno et al. | ............... | 257/133 |
| 6,621,121 | B2 | | 9/2003 | Baliga | | |
| 6,815,769 | B2 | * | 11/2004 | Pfirsch et al. | ............... | 257/341 |
| 2010/0193835 | A1 | * | 8/2010 | Hshieh | ................... | 257/139 |
| 2012/0176828 | A1 | | 7/2012 | Shiraishi et al. | | |
| 2012/0273897 | A1 | | 11/2012 | Shiraishi et al. | | |
| 2013/0001640 | A1 | * | 1/2013 | Pfirsch et al. | ............... | 257/147 |
| 2013/0020634 | A1 | | 1/2013 | Watanabe et al. | | |

FOREIGN PATENT DOCUMENTS

| EP | 1 032 047 A2 | 8/2000 |
| JP | 2000-307116 A | 11/2000 |
| JP | 2002-528916 A | 9/2002 |
| JP | 2004-039838 A | 2/2004 |
| JP | 2005-327806 A | 11/2005 |

* cited by examiner

*Primary Examiner* — Evan Pert
(74) *Attorney, Agent, or Firm* — Volpe and Koenig, P.C.

(57) ABSTRACT

It is intended to provide a semiconductor device capable to improve a controllability of dv/dt by a gate drive circuit during a turn-on switching period, while maintaining a low loss and a high breakdown voltage. Trench gates are disposed so as to have narrow distance regions and wide distance regions, wherein each of the narrow distance regions is provided with a channel region, and each of the wide distance regions is provided with trenches, each trench having an electrode electrically connected to the emitter electrode. In this manner, even if a floating-p layer is removed, it is possible to reduce a feedback capacity and maintain a breakdown voltage.

13 Claims, 7 Drawing Sheets

FIG. 10 — Related Art —

FIG. 11 – Related Art –
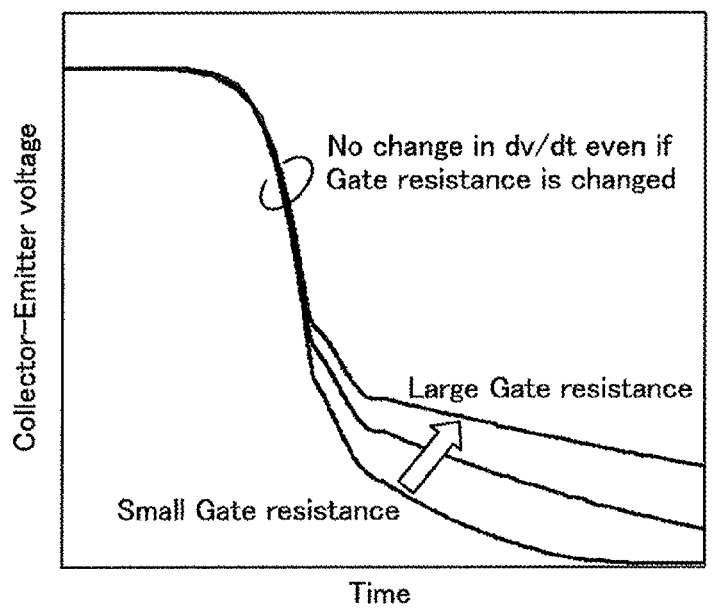
FIG. 12 – Related Art –
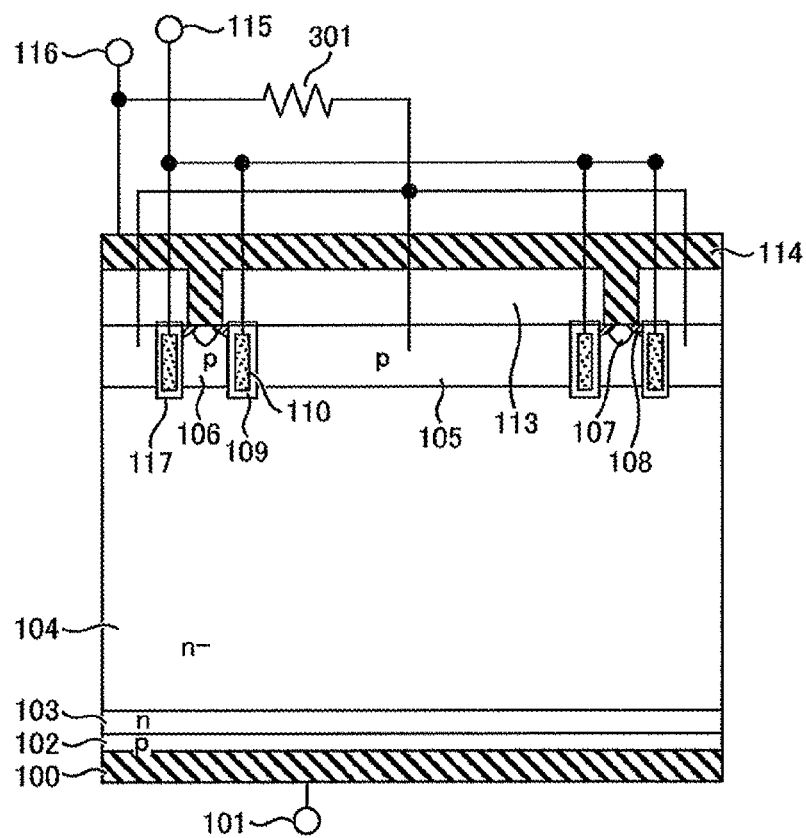

SEMICONDUCTOR DEVICE AND POWER CONVERSION DEVICE USING SAME

CROSS REFERENCE TO RELATED APPLICATION

The present application claims benefit of the filing date of Japanese Patent Application No. JP2012/144893 filed on Jun. 28, 2012 which is incorporated herein by reference.

TECHNICAL FIELD

The present invention relates to a semiconductor device and a power conversion device using the same, especially a semiconductor device provided with a structure suitable for an insulated gate bipolar transistor having a trench insulated gate structure, and a power conversion device using the same.

BACKGROUND OF THE INVENTION

An Insulated Gate Bipolar Transistor (hereinafter abbreviated as IGBT) is a semiconductor switching element in which a current flowing between a collector electrode and an emitter electrode is controlled by a voltage applied to a gate electrode. As a controllable power widely ranging from tens of watts up to hundreds of thousands of watts, as well as a controllable switching frequency widely ranging from tens of hertz up to and over hundreds of kilohertz, IGBTS are widely used for ranging from low electric power equipments such as an air conditioner and a microwave oven for domestic use, to high electric power equipments such as an inverter used for a railroad and ironworks.

The IGBT is required to have a low loss for high efficiency of the electric power equipments described above, and as such required to reduce a loss such as a conduction loss and a switching loss. At the same time, in order to prevent problems such as an EMC noise, a malfunction and a dielectric breakdown of a motor, what is required is a capability to control dv/dt in accordance with the specifications of applications.

Therefore, Japanese Patent Application Publication No. JP2000-307116A discloses an IGBT having a structure in which a dispositional gap of trenches 117 is changed, as shown in FIG. 10. At an IGBT in FIG. 10, a floating-p layer 105 is provided in a wide distance portion between the trenches 117, without forming a p-type channel layer 106.

According to this structure, as a current flows through only a narrow distance portion between the trenches 117, an over current flowing through at the time of the short circuit can be suppressed, hence avalanche capability of an element can be improved. In addition, as a part of hole current flows into the p-type channel layer 106 via the floating-p layer 105, a hole density in the vicinity of trenches 117 is increased, hence an ON-voltage of the IGBT can be lowered. Further, a p-n junction formed with the floating-p layer 105 and an n--type drift layer 104 relaxes the electric field applied to corner portions of the trenches 117, thereby enabling to maintain a breakdown voltage.

However, in the conventional IGBT structure shown in FIG. 10, there is often a case that controllability over the time rate of change of an output voltage dv/dt of the IGBT and diodes of arm pairs is reduced when turning on the IGBT. In FIG. 11, an example of calculated waveforms of a collector-emitter voltage is shown when turning on the IGBT. As shown in FIG. 11, there is a period that the dv/dt of the collector-emitter voltage remains unchanged even the gate resistance is changed, therefore being uncontrollable.

The reason for this is considered as follows. That is, when the IGBT is turned on, holes flow transiently into floating-p layer 105 in FIG. 10, a voltage of the floating-p layer 105 is increased. At this time, as a displacement current flows into a gate electrode 110 via a feedback capacity formed with a gate insulation film 109, raising the gate voltage, the time rate of change of a collector current di/dt, which is determined by the product of a mutual conductance "gm" of a MOSFET structure and the time rate of change of a gate-emitter voltage dvge/dt, increases and then a switching speed is accelerated.

Amount of holes flowing transiently into the floating-p layer 105 is primarily determined by an internal structure of a semiconductor and difficult to control with an external gate resistance. Therefore, it is impossible to control the accelerated di/dt with the external gate resistance, and as a result there arises a time as shown in FIG. 11 when the time rate of change of the collector voltage dv/dt cannot be controlled by the gate resistance.

In order to suppress the raising of the gate voltage caused by the floating-p layer 105, following techniques are disclosed.

In a technique disclosed in Japanese Patent Application Publication No. JP2004-039838A, by electrically connecting the floating-p layer 105 and the emitter electrode 114 via a resistor 301 as shown in FIG. 12, the raising of voltage of the floating-p layer 105 is suppressed. In this manner, a displacement current flowing into the gate electrode 110 from the floating-p layer 105 is reduced, hence raising the gate voltage is suppressed, thereby improving the controllability of the dv/dt as a result.

In a technique disclosed in Japanese Patent Application Publication No. JP2005-327806A, by filling in the wide region between the trenches with an insulation film, the floating-p layer is removed and by eliminating voltage variation at the gate caused by the floating-p layer, the controllability of the dv/dt can be improved. Further, as one side of the gate electrode is covered with a thick insulation film, the feedback capacity can be reduced, and thereby the controllability of the dv/dt can be more improved.

In a technique disclosed in Japanese Translation of PCT Patent Application Publication No. JP2002-528916A, by providing in a trench a gate electrode at the upper side and an embedded electrode, which is connected to the source electrode, at the lower side via an insulation film, the feedback capacity of the gate can be reduced.

SUMMARY OF THE INVENTION

Problems to be Solved by the Invention

It is required for an IGBT to improve the controllability of the dv/dt by the gate drive circuit during a turn-on switching period, while maintaining a low loss and a high breakdown voltage. In regard to this requirement, the prior art described above has following problems.

In case of the technique disclosed in Japanese Patent Application Publication No. JP2004-039838A, the smaller the resistance value of the resistor 301 between the floating-p layer 105 and the emitter electrode 114 is made, the more the controllability of the dv/dt improves, but as a part of the hole current injected in an ON-state flows out to the emitter electrode 114 via the resistor 301, an effect to promote injection of electron is degraded, hence an ON-voltage rises and a power loss increases. On the other hand, if the resistance value of the resistor 301 is increased, the rising of the ON-voltage becomes smaller, but the controllability of the dv/dt is reduced.

In case of the technique disclosed in Japanese Patent Application Publication No. JP2005-327806A, as the floating-p layer is removed, electric field is concentrated at the corner portions of the gate electrode, hence maintaining the breakdown voltage is difficult.

In case of the technique disclosed in Japanese Patent Application Publication No. JP2002-528916A, by providing an embedded electrode which is connected to the source electrode, the feedback capacity can be reduced, but this technique is for a MOSFET and there is no description about maintaining a low loss and a high breakdown voltage for an IGBT.

The present invention is made in view of the above problems, and an objective is to provide a semiconductor device which can improve the controllability of the dv/dt during turn-on switching period, while maintaining a low loss and a high breakdown voltage, and a power conversion device using the same.

Means to Solve Problems

The semiconductor device according to the present invention is provided with trench gates, each having an embedded electrode electrically connected to the emitter electrode, which are disposed so as to have narrow distance regions and wide distance regions, wherein a channel region is provided in a narrow distance region and trenches, each having an electrode electrically connected to the emitter electrode, are provided in a wide distance region. In this manner, a breakdown voltage can be maintained even if a floating layer in the conventional structure is removed, and further the feedback capacity of the gate can be reduced, thereby improving the controllability of the dv/dt.

A semiconductor device according to one aspect of the present invention includes: a first semiconductor layer of a first conductivity type; a second semiconductor layer of a second conductivity type adjacent to the first semiconductor layer; a plurality of first trenches; gate electrodes each of which is provided in each of the plurality of the first trenches; and a first and second regions which are disposed between the first trenches and the second region has a wider distance between the first trenches than the first region. The first region of the present aspect is provided with a third semiconductor layer of the first conductivity type adjacent to the second semiconductor layer, and a fourth semiconductor layer of the second conductivity type adjacent to the third semiconductor layer, wherein the gate electrode is disposed in the first trench, contacting with the third semiconductor layer, the fourth semiconductor layer and the second semiconductor on each surface thereof via a first insulation film, and provided with a first electrode that contacts in a low resistance with the first semiconductor layer and a second electrode that contacts in a low resistance with the third semiconductor layer and the fourth semiconductor layer. Further, the second region of the present aspect is provided with a plurality of second trenches, and a third electrode disposed in each of the plurality of the second trenches, having a second insulation film between itself and a trench sidewall, and electrically connected to the second electrode, wherein the second semiconductor layer is interposed between the first trench and the second trench.

Here, the first and second conductivity types are, for example, a p-type and an n-type, respectively, being opposite conductivity types each other.

Effects of the Invention

According to a semiconductor device and a power conversion device using the same of the present invention, it is possible to reduce a feedback capacity, while maintaining a low loss and a high breakdown voltage, and to improve the controllability of the dv/dt by a gate drive circuit during the turn-on switching period.

BRIEF DESCRIPTION OF THE DRAWINGS

FIG. 10 is a sectional view showing an IGBT disclosed in Japanese Patent Application Publication No. JP2000-307116A.

FIG. 11 is a characteristic diagram showing a calculated waveform of a collector-emitter voltage during the turn-on period of the IGBT disclosed in Japanese Patent Application Publication No. JP2000-307116A.

FIG. 12 is a sectional view showing an IGBT disclosed in Japanese Patent Application Publication No. JP2004-039838A.

EMBODIMENTS OF THE INVENTION

A description will be given below in detail of a semiconductor device according to the present invention, based on depicted embodiments.

First Embodiment

Figure 1:
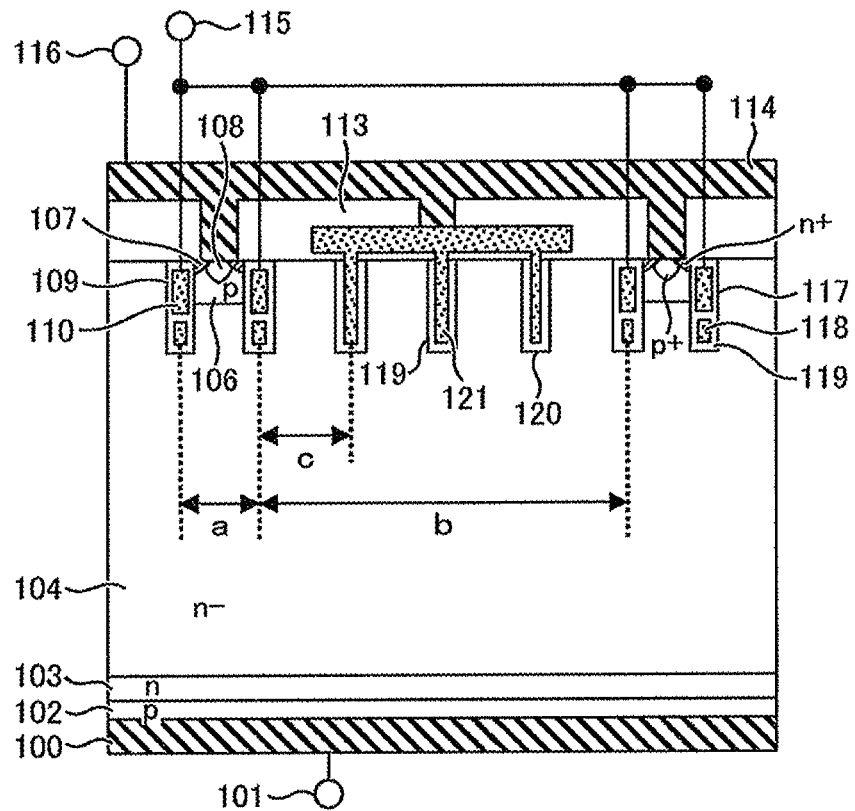
FIG. 1 is a sectional view showing an IGBT according to a first embodiment of the present invention.

FIG. 1 shows a cross-sectional structure of an IGBT according to a first embodiment of the present invention.

An IGBT according to the present embodiment includes: a collector electrode 100; a p-type collector layer 102; an n-type buffer layer 103; an n--type drift layer 104; a trench 117; a gate electrode 110 disposed in the trench 117; a gate insulator 109; an embedded electrode 118 electrically connected to the emitter electrode; an insulation film 119 around the embedded electrode; a p-type channel layer 106 provided in a narrow distance region between the trenches 117; an n+-type emitter layer 107 and a p+-type contact layer 108 that are adjacent to the p-type channel layer 106; a trench 120 provided in a wide distance region between the trenches 117; an electrode 121 electrically connected to the emitter electrode disposed in each of the trenches 120; an insulation film 119 around the electrode 121; an interlayer insulator 113; an emitter electrode 114; a collector terminal 101; an emitter terminal 116; and a gate terminal 115. Above terminals are electrically connected to the corresponding electrodes, providing connection points between the IGBT and an external circuit.

A notation of n+, n, n− in the figure indicates that a carrier concentration by n-type impurity becomes relatively lower in this order. A carrier concentration by p-type impurity is notated in the same way.

The p-type collector layer 102 is adjacent to an n-type semiconductor layer composed of the n-type buffer layer 103 and the n−-type drift layer 104 each other. Here, the n-type buffer layer 103, which forms a p-n junction with the p-type collector layer 102, has a lower carrier concentration than the p-type collector layer 102. It should be noted that if a desired breakdown voltage is obtainable, the n-type semiconductor layer may be composed of the n−-type drift layer 104 only.

A p-type semiconductor layer composed of the p-type channel layer 106 and the p+-type contact layer 108 is adjacent to the n-type semiconductor layer composed of the n-type buffer layer 103 and the n−-type drift layer 104. The p-type channel layer 106 forms a p-n junction with the n−-type drift layer 104, and has a higher carrier concentration than the n−-type drift layer 104.

The collector electrode 100 is electrically connected the p-type collector layer 102 with low-resistance contact. The emitter electrode 114 is electrically connected to the p-type semiconductor layer composed of the p+-type contact layer 108 and the p-type channel layer 106 at the p+-type contact layer 108 with low-resistance contact. Also, in the trench 117, the gate electrode 110 is provided on the surfaces of the n+-type emitter layer 107, the p-type channel layer 106, and the n−-type drift layer 104 via the gate insulator 109.

At the present IGBT, the trenches 117, each having the gate electrode 110 and the embedded electrode 118 which is located below the gate electrode 110 and electrically connected to the emitter electrode 114, are disposed so as to have a narrow distance region (distance: a) and a wide distance region (distance: b), as shown in FIG. 1, wherein the p-type channel layer 106 is provided in the narrow distance region and the trench 120, having the electrode 121 that is electrically connected to the emitter electrode 114, is provided in the wide distance region. By providing the p-type channel layers 106 in the narrow distance regions between the trenches 117, it is possible to reduce the ON-voltage, while limiting a saturation current. In addition, by providing the trenches 120, each having the electrode 121 that is electrically connected to the emitter electrode 114, in the wide distance regions, when a voltage is applied across the emitter and the collector, electric fields applied to the corner portions of the trenches 117 can be relaxed and the breakdown voltage can be maintained even when the floating-p layer 105 that has been provided at a conventional IGBT (FIG. 10) is not provided. Further, by providing the electrode 118, which is electrically connected to the emitter electrode via the insulation film 119, below the gate electrode 110 in the trench 117, the feedback capacity of the gate can be reduced, thereby improving the controllability of the dv/dt while maintaining the breakdown voltage.

Figure 2:
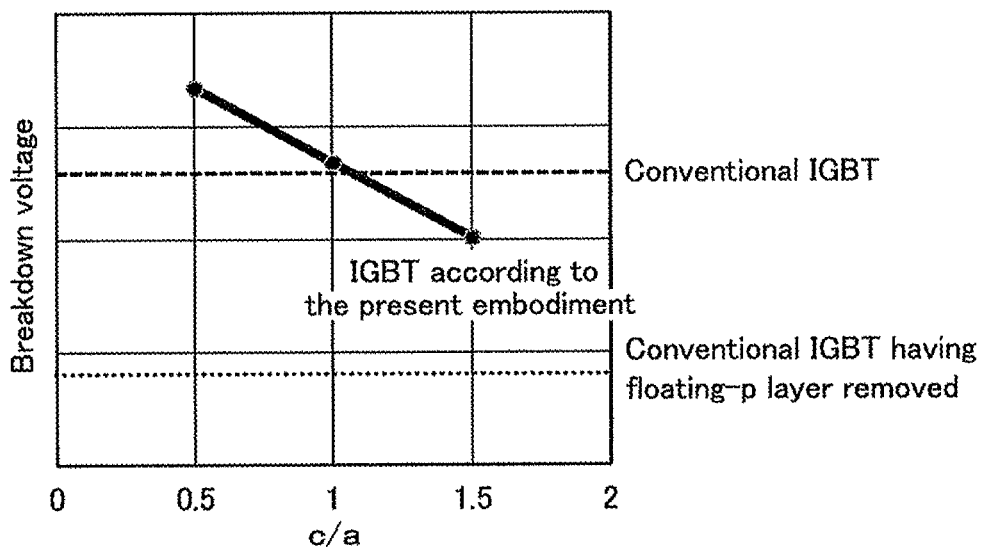
FIG. 2 shows breakdown voltage calculation results of a conventional IGBT, a conventional IGBT out of which a floating-p layer is removed, and an IGBT according to the first embodiment.

FIG. 2 shows an example of breakdown voltage calculation results of a conventional IGBT (FIG. 10), a conventional IGBT out of which a floating-p layer is removed, and an IGBT according to the first embodiment. Also shown is the relationship between a ratio "c/a" and the breakdown voltage for the IGBT according to the first embodiment, where "a" is a narrow distance between the trenches 117 and "c" is a distance between the trench 117 and the closest trench 120 to the trench 117. From FIG. 2, it is observed that the breakdown voltage decreases when the floating-p layer 105 is removed in the conventional IGBT structure. This is because the p-n junction formed with the floating-p layer 105 and the n−-type drift layer 104 relaxes the electric fields applied to the corner portions of the trenches 117. By providing the trenches 120, the IGBT according to the first embodiment can relax the electric fields applied to the corner portions of the trenches 117 and maintain the high breakdown voltage. However, if the distance "c" becomes larger, as shown in the figure, the electric fields applied the corner portions of the trenches 117 are increased, therefore it is desirable that the distance "c" between the trench 117 and the closest trench 120 to the trench 117 is less than or equal to the narrow distance "a" between the trenches 117.

Figure 3:
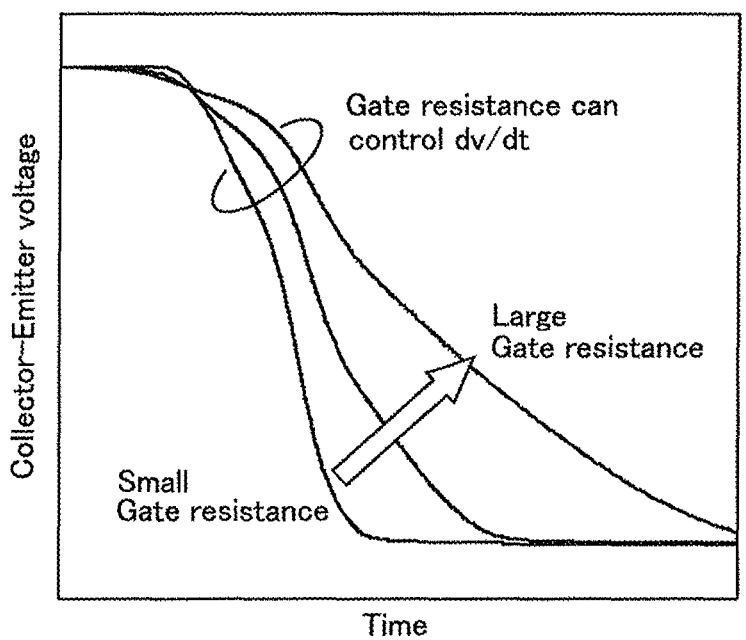
FIG. 3 is a characteristic diagram showing a calculated waveform example of a collector-emitter voltage during the turn-on period of the IGBT according to the first embodiment.

FIG. 3 shows a calculated waveform example of a collector-emitter voltage during the turn-on period of the IGBT according to the first embodiment. As shown in FIG. 3, in case of the IGBT according to the first embodiment, by changing the gate resistance, the dv/dt of the collector-emitter voltage can be controlled to a large extent, compared to that of the conventional IGBT shown in FIG. 11.

Figure 4A:
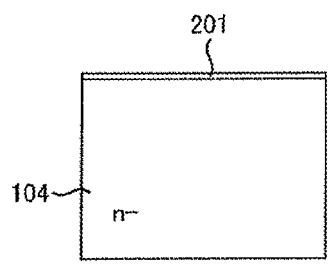
FIGS. 4A to 4O are diagrams showing a manufacturing process of the IGBT according to the first embodiment.
Figure 4B:
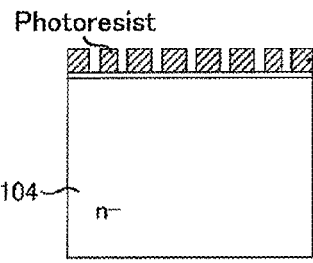
Figure 4C:
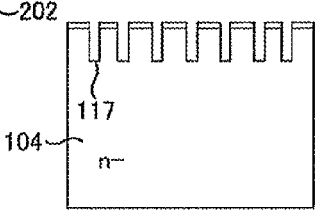
Figure 4D:
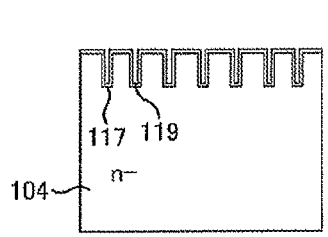
Figure 4E:
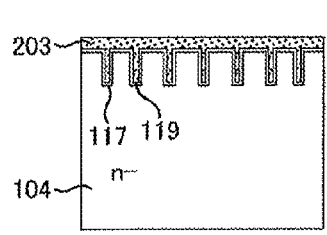
Figure 4F:
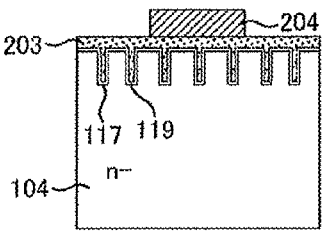
Figure 4G:
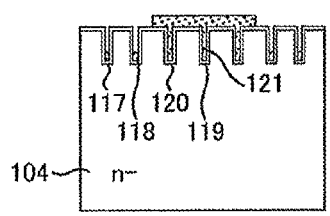
Figure 4H:
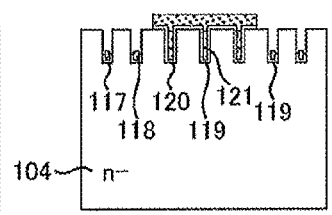
Figure 4I:
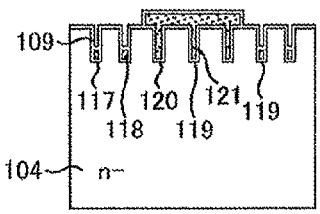
Figure 4J:
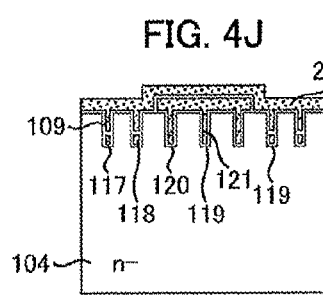
Figure 4K:
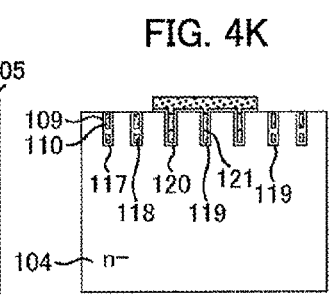
Figure 4L:
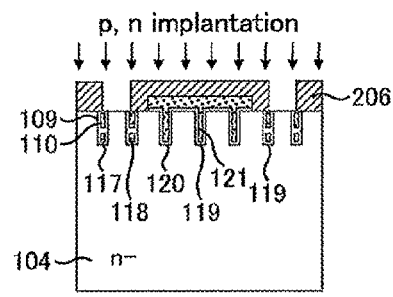
Figure 4M:
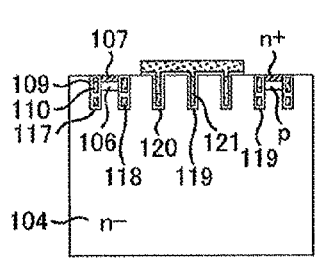
Figure 4N:
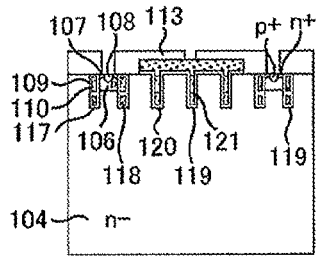
Figure 4O:
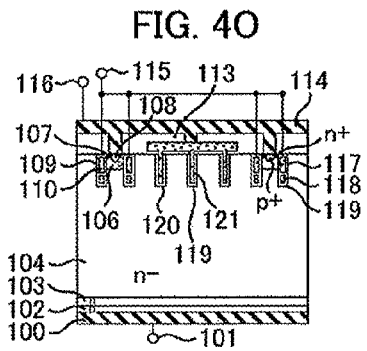

FIGS. 4A to 4O show an example of a manufacturing process of the IGBT according to the first embodiment.

To begin with, a surface oxide film 201 is formed on the n−-type drift layer 104 shown in FIG. 4A, patterning is performed with a photoresist 202 as shown in FIG. 4B, and the trenches 117 are formed by anisotropic etching as shown in FIG. 4C.

Next, as shown in FIG. 4D, the insulation film 119 is formed. Here, it is desirable that the thickness of the insulation film 119 is thicker than the gate insulation film 109, which will be described later, from the viewpoint of reducing a capacity and securing a dielectric breakdown voltage. Next, polysilicon 203 is deposited for electrodes as shown in FIG. 4E, patterning is performed with a photoresist 204 as shown in FIG. 4F, and dry etching is performed on the polysilicon as shown in FIG. 4G so that polysilicon is left in the trenches 117 at the bottom to form the embedded electrodes 118, and in the trenches 120 and on the surface to form the electrodes 121. Here, polysilicon to form the embedded electrodes 118 is etched to a position deeper than the p-type channel layer 106, which will be described later. Also, polysilicon to form the embedded electrodes 118 is connected to the emitter electrode 114 at other sections such as periphery of a chip, which is not shown. Next, as shown in FIG. 4H, the insulation film 119 in the trenches 117 is etched. Here, the insulation film 119 is etched so as to be left at around the polysilicon that forms the embedded electrodes 118. Next, as shown in FIG. 4I, the gate insulation film 109 is formed in the trenches 117. Then, as shown in FIG. 4J, polysilicon 205 for the gate electrodes is deposited, and as shown in FIG. 4K, the gate electrodes 110 are formed by dry etching.

Next, as shown by FIG. 4L, patterning is performed by a photoresist 206, followed by ion-implantation of p-type ions and n-type ions, then as shown in FIG. 4M, the p-type channel layer 106 and the n+-type emitter layer 107 are formed. Thereafter, as shown in FIG. 4N, the interlayer insulator 113 is deposited then etched to form the p+-type contact layer 108. Next, as shown in FIG. 4O, the emitter electrode 114 is formed, and the n-type buffer layer 103, the p-type collector layer 102, and the collector electrode 100 are formed on the back surface.

It should be noted that in the present embodiment the p-type collector layer 102 and the n-type buffer layer 103 are formed on the back surface after processing the top surface, but at the process in FIG. 4A an epitaxial substrate or the like may be used, on which the p-type collector layer 102 and the n-type buffer layer 103 are already formed.

Hereinafter, other embodiments will be described mainly on the differences from the first embodiment.

Second Embodiment

Figure 5:
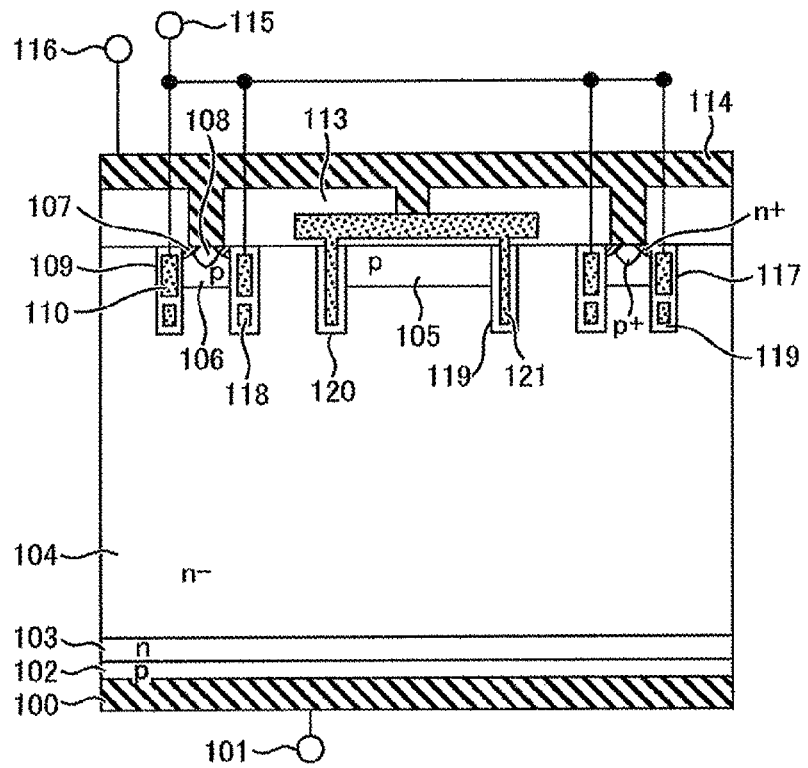
FIG. 5 is a sectional view showing an IGBT according to a second embodiment of the present invention.

FIG. 5 shows a cross-sectional structure of the IGBT according to a second embodiment of the present invention. In case of the second embodiment, only the trenches 120 located at both ends, which are the closest to the trenches 117, are left, and a floating-p layer 105 is provided therebetween. By removing the trenches 120 other than those at both ends, the number of trenches can be reduced, thereby improving a process yield as well as reducing the collector-emitter capacity. Even if the trenches 120 other than those at both ends are removed, it is possible to relax electric fields at the corner portions by providing the floating-p layer 105. In addition, even if a potential at the floating-p layer 105 is raised during the turn-on period, as the gate electrode 110 and the floating-p layer 105 are apart, having the n--type drift layer 104 interposed therebetween, the gate potential is not affected and it is possible to improve the controllability of the dv/dt.

Third Embodiment

Figure 6:
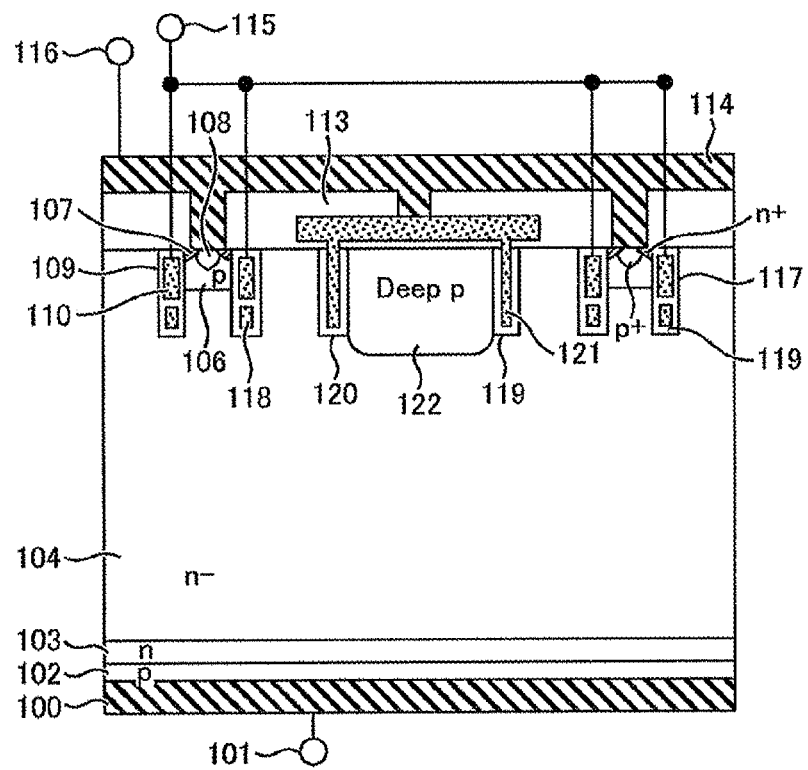
FIG. 6 is a sectional view showing an IGBT according to a third embodiment of the present invention.

FIG. 6 shows a cross-sectional structure of the IGBT according to a third embodiment of the present invention. In case of the third embodiment, a floating-p layer 122 deeper than the trenches 120 is provided, instead of the floating-p layer 105 provided in case of the second embodiment. By forming the floating-p layer 122 deeper than the trenches 120, it is possible to relax electric fields at the corner portions of the trenches 120, thereby enabling to maintain a high breakdown voltage.

Fourth Embodiment

Figure 7:
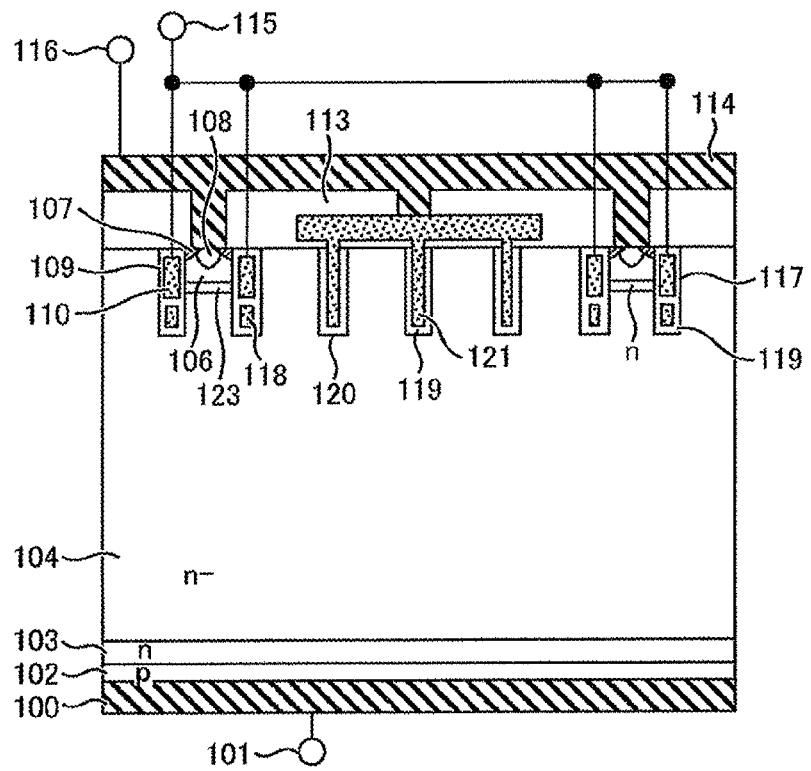
FIG. 7 is a sectional view showing an IGBT according to a fourth embodiment of the present invention.

FIG. 7 shows a cross-sectional structure of the IGBT according to a fourth embodiment of the present invention. In case of the fourth embodiment, an n-type layer 123 is provided below the p-type channel layer 106, i.e., between the p-channel layer 106 and the n--type drift layer 104. In other words, the n-type semiconductor layer adjacent to the p-type semiconductor layer, which is composed of the p-channel layer 106 and the p+-type contact layer 108, is composed of the n-type buffer layer 103, the n--type drift layer 104, and the n-type layer 123. The n-type layer 123 forms a p-n junction with the p-type channel layer 106. A carrier concentration of the n-type layer 123 is lower than that of the p-type channel layer 106, and higher than that of the n--type drift layer 104. As the n-type layer 123 becomes a barrier against holes flowing into the emitter electrode 114 via the p-type channel layer 106 and the p+-type contact layer 108, a hole concentration at the n--type drift layer 104 in the vicinity of the p-type channel layer 106 increases, hence it is possible to reduce the ON-voltage.

Fifth Embodiment

Figure 8:
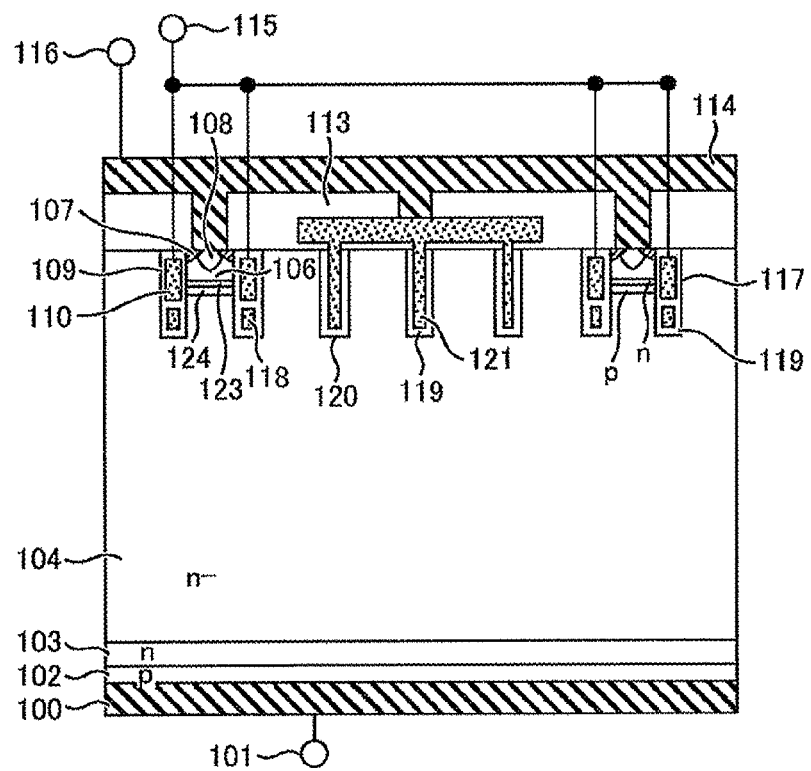
FIG. 8 is a sectional view showing an IGBT according to a fifth embodiment of the present invention.

FIG. 8 shows a cross-sectional structure of the IGBT according to a fifth embodiment of the present invention. In case of the fifth embodiment, a p-type layer 124 is further provided below the n-type layer 123, i.e., between the n-type layer 123 and the n--type drift layer 104. In other words, the p-type semiconductor layer adjacent to the n-type semiconductor layer, which is composed of the n-type buffer layer 103, the n--type drift layer 104, and the n-type layer 123, is composed of the p-type layer 124, the p-channel layer 106 and the p+-type contact layer 108. The p-type layer 124 forms a p-n junction with the n-type layer 123. In case of the fourth embodiment described above, the more the carrier concentration of the n-type layer 123 is increased, the higher the barrier against the holes becomes, thereby enhancing an effect of reducing the ON-voltage, but on the other hand an electric field at the n-type layer 123 becomes stronger during the switch is OFF, negatively affecting the breakdown voltage. In case of the fifth embodiment, by adding the p-type layer 124, the electric field strength in the n-type layer 123 is relaxed, therefore the breakdown voltage can be maintained even if the carrier concentration of the n-type layer 123 is increased, and it is possible to further reduce the ON-voltage.

Sixth Embodiment

Figure 9:
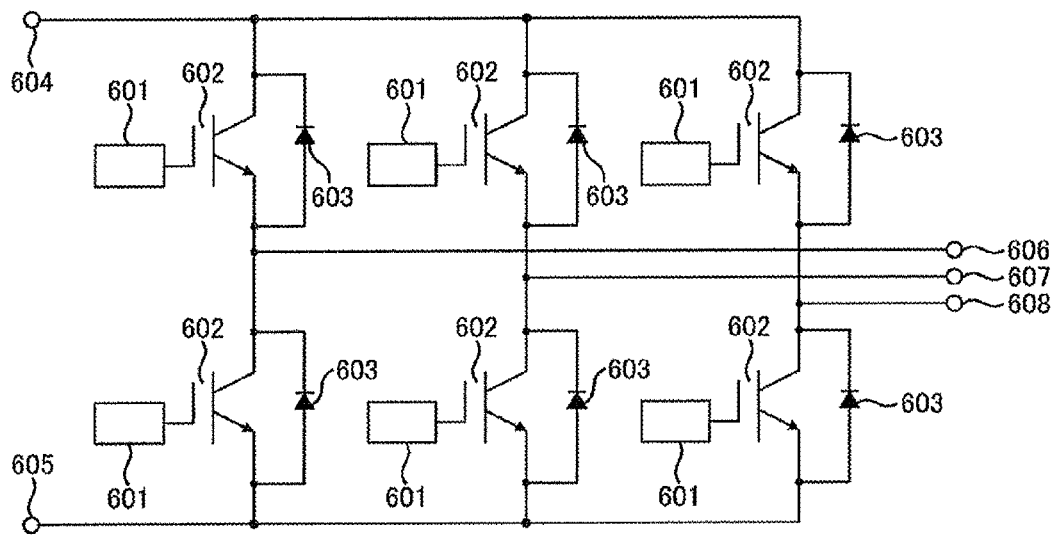
FIG. 9 is a circuit diagram showing a main circuit of a power conversion device according to a sixth embodiment of the present invention.
Figure 9:
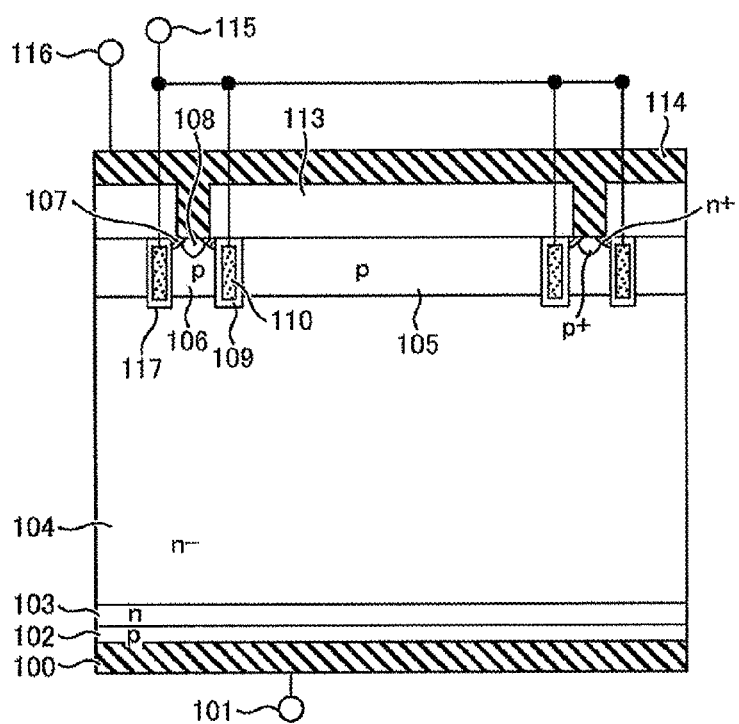

FIG. 9 shows the main circuit of the power conversion device according to a sixth embodiment of the present invention. The sixth embodiment is an inverter unit, where 601 denotes a gate drive circuit, 602 denotes either one of IGBTS of the first to fifth embodiments described above, 603 denotes a diode connected back-to-back to each IGBT, 604 and 605 denote a pair of DC input terminals, and 606, 607 and 608 denote AC output terminals. As the number of phases of the alternating current in the present embodiment is three, three AC output terminals are provided. Each IGBT is connected between either one of the AC output terminals and either one of the DC input terminals. By IGBTS performing ON-OFF switching, a DC power is converted to an AC power.

By applying an IGBT according to either one of the first to fifth embodiments described above as a semiconductor switching element in the power conversion device, it is possible to realize a low loss and high reliability of the power conversion device.

It should be noted that the description has been given of the inverter device in the sixth embodiment, but the same effect can be obtained for other power conversion devices such as a converter device and a chopper. In case of a converter device, 604 and 605 become DC output terminals, and 606, 607 and 608 become AC input terminals, and by IGBTS performing ON-OFF switching, an AC power is converted to a DC power. In addition, the number of phases of the alternating current is not limited to three phases, and may be a plurality of phases.

Hereinabove, description has been given in detail of the embodiments of the present invention, but without being limited to the exemplary embodiments described above, various embodiments are possible within the scope of the technical ideas of the present invention. For example, IGBTS according to the first to fifth embodiments described above have n-type channels, but the present invention is also applicable to IGBTS having p-type channels. The same is true also for other device structure having trench gates.

The invention claimed is:

1. A semiconductor device comprising:
a first semiconductor layer of a first conductivity type;
a second semiconductor layer of a second conductivity type adjacent to the first semiconductor layer;
a plurality of first trenches;
gate electrodes each of which is provided in each of the plurality of the first trenches; and
a first and a second regions which are disposed between the first trenches and the second region has a wider distance between the first trenches than the first region,
wherein the first region is provided with:
a third semiconductor layer of the first conductivity type adjacent to the second semiconductor layer; and a fourth semiconductor layer of the second conductivity type adjacent to the third semiconductor layer, the gate electrode is disposed in the first trench, contacting with the third semiconductor layer, the fourth semiconductor layer and the second semiconductor on each surface thereof via a first insulation film, and provided with:

a first electrode that contacts in a low resistance with the first semiconductor layer; and a second electrode that contacts in a low resistance with the third semiconductor layer and the fourth semiconductor layer, the second region is provided with:

a plurality of second trenches; and a third electrode disposed in each of the plurality of the second trenches, having a second insulation film between itself and a trench sidewall, and electrically connected to the second electrode, and the second semiconductor layer is interposed between the first trench and the second trench.

2. The semiconductor device, according to claim 1, further comprising:

a fourth electrode that is disposed below the gate electrode in the first trench, having a third insulation film between itself and a trench sidewall, and electrically connected to the second electrode.

3. The semiconductor device, according to claim 1, wherein a thickness of the second insulation film is thicker than a thickness of the first insulation film.

4. The semiconductor device, according to claim 2, wherein thicknesses of the second and third insulation films are thicker than a thickness of the first insulation film.

5. The semiconductor device, according to claim 1, wherein a distance between the second trench closest to the first trench, and the first trench is equal to or smaller than a distance between the first trenches in the first region.

6. The semiconductor device, according to claim 1, wherein the second region is further provided with a fifth semiconductor layer, in a floating state, of the second conductivity type, between the second trenches.

7. The semiconductor device, according to claim 6, wherein a deepness of the fifth semiconductor layer is deeper than a deepness of the second trench.

8. The semiconductor device, according to claim 1, wherein the gate electrode and the third electrode are made of polysilicon.

9. The semiconductor device, according to claim 2, wherein the gate electrode and the third electrode, and the fourth electrode are made of polysilicon.

10. The semiconductor device, according to claim 1, wherein the second semiconductor layer includes a first portion that is adjacent to the first semiconductor layer, and a second portion that is adjacent to the first portion, and a carrier concentration of the first portion is higher than a carrier concentration of the second portion.

11. The semiconductor device, according to claim 1, wherein the second semiconductor layer includes a first portion that is adjacent to the third semiconductor layer, and a second portion that is adjacent to the first portion, and a carrier concentration of the first portion is higher than a carrier concentration of the second portion.

12. The semiconductor device, according to claim 1, wherein a fifth semiconductor layer of the second conductivity type is provided in the third semiconductor layer, and a carrier concentration of the fifth semiconductor layer is higher than a carrier concentration of the second semiconductor layer.

13. A power conversion device comprising:

a pair of DC terminals;

AC terminals, number of which is equal to a number of phases; and a plurality of semiconductor switching elements which are connected between the DC terminals and the AC terminals, wherein each of the plurality of the semiconductor switching elements is the semiconductor device according to claim 1.

* * * * *